(12) United States Patent
Shao et al.

(10) Patent No.: US 10,923,024 B2
(45) Date of Patent: Feb. 16, 2021

(54) LED DISPLAY MODULE AND METHOD OF MAKING THEREOF

(71) Applicant: SCT LTD., Grand Cayman (KY)

(72) Inventors: Shihfeng Shao, Milpitas, CA (US); Chang Hung Pan, Milpitas, CA (US); Heng Liu, Milpitas, CA (US); Eric Li, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 119 days.

(21) Appl. No.: 16/219,390

(22) Filed: Dec. 13, 2018

(65) Prior Publication Data

US 2020/0193895 A1  Jun. 18, 2020

(51) Int. Cl.
| | |
|---|---|
| *H01L 33/00* | (2010.01) |
| *G09G 3/32* | (2016.01) |
| *H01L 33/26* | (2010.01) |
| *H01L 33/50* | (2010.01) |
| *H01L 33/62* | (2010.01) |
| *H05K 1/02* | (2006.01) |
| *H01L 25/075* | (2006.01) |
| *H01L 33/64* | (2010.01) |

(52) U.S. Cl.
CPC ........... *G09G 3/32* (2013.01); *H01L 25/0753* (2013.01); *H01L 33/26* (2013.01); *H01L 33/505* (2013.01); *H01L 33/62* (2013.01); *H01L 33/647* (2013.01); *H05K 1/0274* (2013.01); *H01L 2933/0066* (2013.01)

(58) Field of Classification Search
None
See application file for complete search history.

(56) References Cited

U.S. PATENT DOCUMENTS

2009/0267108 A1* 10/2009 Lin ................. H01L 33/486
257/99

* cited by examiner

*Primary Examiner* — Reema Patel
(74) *Attorney, Agent, or Firm* — Novick, Kim & Lee, PLLC; Allen Xue

(57) ABSTRACT

An LED display module contains a PCB, one or more layers of molding compound disposed on the surface of the PCB, a network of conductive tracks disposed on a surface of the one or more layer of molding compound away from the PCB, a plurality of through-holes extending through the one or more layers of molding compound, and an array of LED chips disposed in the one or more layers of molding compound. Each of electrodes on the LED chip is connected to one of the conductive pads via a conductive path. The conductive path comprises a conductive material inside one of the plurality of the through-holes and a portion of the network of conductive tracks.

22 Claims, 9 Drawing Sheets

LED DISPLAY MODULE AND METHOD OF MAKING THEREOF

TECHNICAL FIELD

The present disclosure relates to electronic packaging, and more particularly, to a light-emitting diode (LED) display module that can be used in various lighting applications.

RELATED ART

LED packages are assemblies that house LED chips. There are many types of LED packages in use today, each with particular applications and advantages. The functions of LED packages include protecting the LED chips and welded lead wires from direct contact with the environment, securing and encapsulating the chip with epoxy or silicone resin, and allowing for versatility and standardization in LED lighting applications. Surface-mount device (SMD) LED, chip-on-board (COB) LED, Multi-COB (MCOB) LED are some of the common LED packaging technologies. As one of recent developments in LED, COB technology provides better lumen-per-watt ratios and efficiency than common SMD LEDs.

A COB or MCOB LED module has an array of LED chips bonded directly to a substrate, e.g., a printed circuit board (PCB). Since a COB LED does not require accessories such as the lead frame, it takes up less space on the PCB so that the COB LED module can have a greater density of LEDs than the SMD LED module. When the COB LED package is energized, it appears more like a lighting panel than an array of individual lights as would be the case when using several SMD LEDs mounted closely together.

A COB LED module may be one of two types of COB, i.e. a wire-bond COB and a flip chip COB. In the wire-bond COB, a lateral LED chip is bonded on a PCB substrate by an bonding epoxy and connects to conductive pads on the PCB via two bonding wires. The thermal energy generated by the lateral LED chip is dissipated through the chip's sapphire substrate, bonding epoxy, followed by the PCB substrate. On the other hand, a flip chip COB has the LED chip directly bonded on conductive pads on a PCB without the bonding wire and epoxy. The heat generated by this type LED is dissipated through chip bonding pads, the conductive pads, followed by the PCB. In comparison with the wire-bond COB, the flip chip COB exhibits less thermal resistance as its thermal dissipating path excludes the sapphire substrate and bonding epoxy that are materials having higher thermal resistance. Also, the packaging cost is reduced without bonding wires and their associated bonding processes. It is thus desirable for a COB LED module maintaining higher thermal resistance without bonding wires.

An LED PCB board tends to generate a significant amount of heat, which may require active cooling. Consequently, metal core PCBs are frequently chosen for LED applications due to their enhanced ability to dissipate heat. Although the metal core PCB transfers and dissipates the heat with much greater efficiency than a traditional rigid PCB, it is expensive. In the COB LED module, the manufacturing cost of its PCB increases even further because it needs more layers or more elaborate pattern printings in a PCB to encompass highly dense LEDs along with their associated conductive pads and conductive tracks in the limited space. The multi-layered PCB having complex metal patterns can also make it difficult to curb noise on the PCB and control other performance parameters. Thus, there is a need for new methods of making LED modules that is of lower costs and the same or better functionality.

SUMMARY

The present disclosure provides LED display modules and their fabrication methods that reduce manufacturing cost and provide enhanced design flexibility as well as providing higher thermal resistance without bonding wires.

According to one embodiment of the present disclosure, an LED display module includes a printed circuit board (PCB) having a plurality of conductive pads disposed on a surface of the PCB, one or more layers of molding compound disposed on the surface of the PCB, a network of conductive tracks disposed on a surface of the one or more layer of molding compound away from the PCB, a plurality of through-holes extending through the one or more layers of molding compound, each leading to one of the plurality of conductive pads, and an array of LED chips disposed in the one or more layers of molding compound. Each of the array of LED chips has a p-electrode and an n-electrode, and each of the p-electrode and the n-electrode is connected to one of the plurality of the conductive pads via a conductive path. The conductive path includes a conductive material inside one of the plurality of through-holes and a portion of the network of conductive tracks.

In some embodiments of the present disclosure, the module includes a first layer of molding compound or a second layer of molding compound, and the network of conductive tracks reside in or on the second layer of molding compound. The network of conductive tracks are applied by inkjet printing. The module further includes a third layer of molding compound encapsulating the array of LED chips and the network of conductive tracks. The module also further includes a black resin portion partially covering the second layer of molding compound. The black resin portion is applied by inkjet printing. The black resin portion is made of a mixture of black pigment and one of a resin, an epoxy, and a silicone.

In another embodiment of the present disclosure, the third layer of molding compound is disposed over a set of R, G and B LED chips to form a color-mixing window. The color-mixing window is made from a transparent epoxy or an epoxy optical diffuser disposed therein.

According to another aspect of the present disclosure, a method of fabricating an LED display module includes a step of providing a panel and disposing an array of LED chips, each having has a p-electrode and an n-electrode, on the panel, a step of providing a printed circuit board (PCB) having a plurality of conductive pads on a surface of the PCB, a step of flipping the panel having the array of LED chips thereon and aligning the panel with the PCB such that the LED chips face the PCB, a step of filling, with an opaque molding compound, in a space between the panel having the array of LED chips and the PCB to form an opaque layer, a step of removing the panel from the opaque layer, in which the array of LED chips are detached from the panel and are partially buried in the opaque layer, a step of covering a transparent layer over the opaque layer, in which the transparent layer having a plurality of via holes, and a plurality of trenches connecting two or more via holes, and a step of disposing a conductive material on the transparent layer to fill in the plurality of via holes and the plurality of trenches with the conductive material, so that the plurality of LED chips are electrically connected to the PCB and two or more of the plurality of LED chips are interconnected.

In still another aspects of the present disclosure, the step of providing the panel and disposing the array of LED chips includes a step of preparing a glass substrate, a step of attaching a thermal release tape onto the substrate, and a step of disposing the array of LED chips, arranged in rows and columns, on the thermal release tape. The step of proving the panel further includes a step of pressing the array of LED chips against the thermal release tape to minimize a gap between the array of LED chips and the thermal release tape. The substrate has a plurality of fiducial marks attached on a surface of the substrate. The step of providing the PCB includes a step of preparing a PCB substrate, a step of performing a surface mount technology (SMT) process on the PCB substrate to place one or more electronic components on a bottom surface of the PCB substrate, and a step of disposing a plurality of lead-free solder columns on the plurality of conductive pads on a top surface of the PCB substrate. The method further includes a step of pressing the panel having the array of LED chips against the PCB after aligning the panel with the PCB so that an end of each of the plurality of solder columns is partially buried in the thermal release tape. The step of removing the panel includes a step of removing the glass substrate and the thermal release tape, and a step of exposing contacts of each of the array of LED chips and the end of each of the plurality of solder columns. The step of covering the transparent layer over the opaque layer comprises a step of molding a transparent layer on the opaque layer, a step of engraving the transparent layer to form a plurality of via holes, in which each of the plurality of via holes leads to each of the plurality of solder columns or each of the p-electrode and the n-electrode of each of the array of the LED chips, and a step of etching the transparent layer to form a plurality of trenches, in which each of the plurality of trenches connects two or more via holes from each other. The transparent layer is made from a resin, an epoxy, or a silicone. The step of engraving the transparent layer comprises a step of engraving the transparent layer by a laser etching to form the plurality of via holes, and a step of cleaning the surface of the transparent layer by a plasma descumming. The step of disposing the conductive material on the transparent layer is conducted by an inkjet printing. The method further includes a step of disposing a black resin on the transparent layer to form a black resin portion partially covering the transparent layer. The step of disposing the black resin on the transparent layer is conducted by an inkjet printing. The black resin is a mixture of black pigment and one of a resin, an epoxy, and a silicone.

In some further aspects of the present disclosure, the method further includes a step of covering a second transparent layer over the transparent layer and the black resin to encapsulate the array of LED chips and the conductive material filled in the plurality of via holes and the plurality of trenches. The method further includes a step of covering black resin layer over the transparent layer. The black resin is a mixture of black pigment and one of a resin, an epoxy, and a silicone. The method also further includes a step of etching the black resin layer and exposing a set of R, G and B LED chips to form a color-mixing cavity, and a step of filling the color-mixing cavity with a transparent epoxy or an epoxy optical diffuser disposed therein to form a color-mixing window.

BRIEF DESCRIPTION OF THE DRAWINGS

The teachings of the present invention can be more readily understood by considering the following detailed description in conjunction with the accompanying drawings.

DETAILED DESCRIPTION

Figure 1:
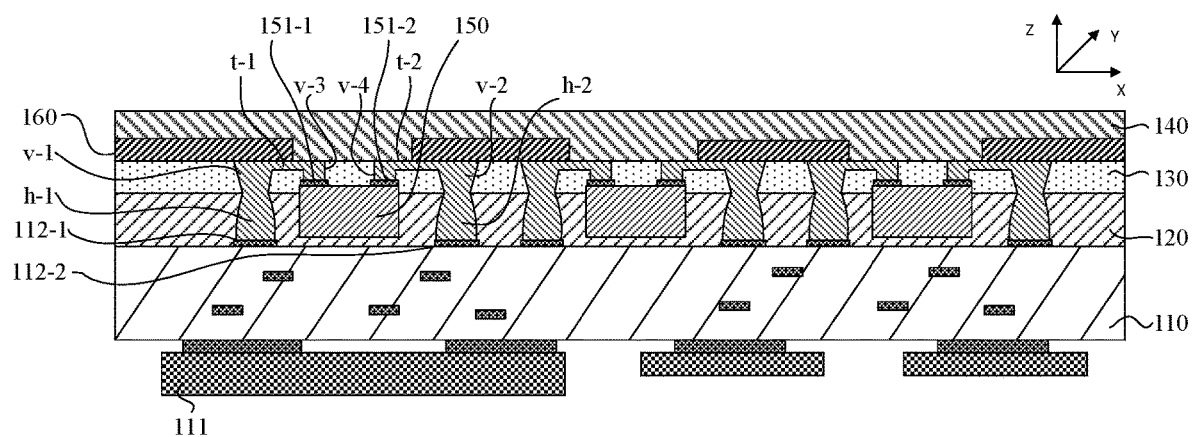
FIG. 1 is a schematic view illustrating a lateral cross section of a COB LED package according to one embodiment of the present disclosure.

Reference will now be made in detail to embodiments of the present disclosure, examples of which are illustrated in the accompanying drawings. It is noted that wherever practicable, similar or like reference numbers may be used in the drawings and may indicate similar or like elements.

The drawings depict embodiments of the present disclosure for purposes of illustration only. One skilled in the art would readily recognize from the following description that alternative embodiments exist without departing from the general principles of the present disclosure.

FIG. 1 is a schematic view illustrating a lateral cross section of a COB LED package according to one embodiment of the present disclosure. As shown in FIG. 1, a LED display module 100 includes a printed circuit board (PCB) 110, a layer of opaque molding compound (an opaque layer 120) covering the PCB 110, and a layer of transparent molding compound (a first transparent layer 130) covering the opaque layer 120, and a layer of transparent molding compound (a second transparent layer 140) covering the first transparent layer 130.

The PCB 110 has a plurality of conductive pads 112-1 and 112-2 disposed on a top surface of the PCB 110 and one or more electronic components 111 on a bottom surface of the PCB substrate. The electronic components may include integrated circuit (IC) passive components such as inductors, resistors, capacitors, etc. These electronic components 111 may be mounted on the surface of the PCB substrate by a surface mount technology (SMT). In some embodiments, the conductive pads 112-1 and 112-2 are flat, usually tin-lead, silver, or gold-plated copper pads without holes. The PCB may also include a driver circuit. Although details of the driver circuit are not shown in the present disclosure, in some embodiments, the driver circuit may include a phase lock loop, a plurality of pulse width modulation engines, a configuration register, a plurality of gain adjustable fast charge current sources, and a serial input/output interface.

An array of LED chips 150 is disposed in the opaque layer. The array of LED chips 150 may comprise a matrix of RGB LED units, each refers to a cluster of three LEDs, namely, a red LED, a green LED, and a blue LED, defining a display pixel. Each LED chip 150 has a p-electrode 151-1 and an n-electrode 151-2.

In this embodiment, each LED chip 150 does not have a base substrate made of sapphire or silicon carbide (SiC) because the chip is placed apart from the surface of the PCB as shown in FIG. 1. In this type of LED, a LED chip or die is generally constructed from a combination of Indium gallium nitride (InGaN) and a sapphire substrate. Most common alternative of the sapphire is silicon carbide (SiC). The sapphire substrate is commonly used because it shares thermal properties with the InGaN. However, the biggest drawback of sapphire is that there is a large mismatch between its crystal lattice structure and that of the InGaN. Such a mismatch introduces microcracks into the LED structure during manufacture which compromise LED efficacy. Since each LED chip does not have such sapphire substrate in this embodiment, manufacturing cost is reduced and LED efficacy can be enhanced.

A pair of through-holes h-1 and h-2 is disposed apart from both sides of each LED chip 150. Each through-hole (h-1 or h-2) extends through the first transparent layer 130 and the opaque layer 120 and leads to one of the plurality of conductive pads (112-1 or 112-2). An upper part of each through-hole may be also called as a via hole (v-1 or v-2). Another pair of via holes v-3 and v-4 may be formed about each LED chip 150, and each of the via holes (v-3 or v-4) extends through the first transparent layer 130 and leads to the n-electrode 151-1 or the p-electrode 151-2 of each LED chip 150. A plurality of trenches t-1 and t-2 is also disposed on a surface of the first transparent layer 130. Each of the plurality of trenches (t-1 or t-2) connects two or more via holes from each other. These via holes and trenches can be made by a laser etching or engraving, or other suitable means.

The through-holes h-1 and h-2 (or via holes v-1 to v-4) are filled with a conductive material, e.g. tin-lead, silver, or gold, or a mixture of tin-lead and silver. Each trench (t-1 or t-2) is also filled with the conductive material to form a conductive track. Filling of the through-hole (or via hole) or the trench may be accomplished by inkjet printing or electron beam evaporation. When filled with a conductive material, the passage connecting the through hole (h-1 or h-2), the conductive pad (112-1 or 112-2), the via hole (v-3 or v-4), and the p or n-electrode (151-1 or 151-2) and the trench (t-1 or t-2) form a conductive path so that each of the p-electrode and the n-electrode (151-1 or 151-2) is connected to one of the plurality of the conductive pads (112-1 or 112-2) via the conductive path.

FIG. 1 shows three LEDs 150 in one row in the LED array arranged in the X-direction. There are additional rows of LEDs 150 arranged preferably in parallel to the row shown in FIG. 1 in the Y-direction. Each of the rows of LED are connected to the PCB as shown in FIG. 1. Further, the trenches t-1 or t-2 extends in the Y-direction, connecting adjacent LEDs in neighboring rows. As such, the conductive paths of the array of LEDs are interconnected via a network of conductive tracks formed on a top surface of the first transparent layer 130.

In this embodiment, the network of the conductive tracks is disposed on the top surface of the first transparent layer 130 instead of on the PCB 110, thus creating an additional surface to accommodate the dense conductive tracks. Since the array of the LED chips 150 are interconnected by this network of the conductive tracks disposed on the first transparent layer 130, the PCB 110 does not need to have overly layered structures or complex conductive line patterns which increase manufacturing cost of PCB and reduce its design flexibility. Also, in accordance with this embodiment, more LED chips can be mounted on a PCB having limited surface area because it is unnecessary to print conductive line patterns for interconnecting the LED chips on the surface of the PCB. This advantage especially provides a COB LED package with greater density of LED chips on the same board, which enables a display to have higher resolution.

Through this network of the conductive track in this embodiment, the array of the LED chips 150 can have a common anode and a common cathode scan configuration, in which the common anode of the LED chips is operatively connected to a power source while the common cathode of the LED chips is connected to the output of current drivers.

The LED display module 100 according to this embodiment may further include a black resin portion 160 partially covering the first transparent layer 130. In particular, the black resin portion 160 may cover tops of the through-holes h-1 and h-2 between the LED chips 150 such that it prevents from a reflection of light on the conductive material in the through-holes h-1 and h-2 in order to increase a contrast ratio of the LED display. In this embodiment, the black resin portion 160 can be selectively molded or printed (preferably, by an inkjet printing) on the first transparent layer 130. In another embodiment, the black resin portion 160 can be formed by photolithography method, in which the molding of the black resin portion 160 can be conducted by spin coating of a photoresist which stays in the structure as a molding material after curing process and is then engraved by UV or laser etching. The black resin portion 160 has a low transparency, e.g. less than 20%, and is made of a mixture of black pigment and one of a resin, an epoxy, and a silicone.

For encapsulation, the second transparent layer 140 of molding compound may cover the first transparent layer 130 and the black resin portion 160. The second transparent layer 140 may be a transparent epoxy or an epoxy having optical diffuser so that different colors from each RGB unit can be mixed in the second transparent layer 140 to provide a white light.

Figure 2:
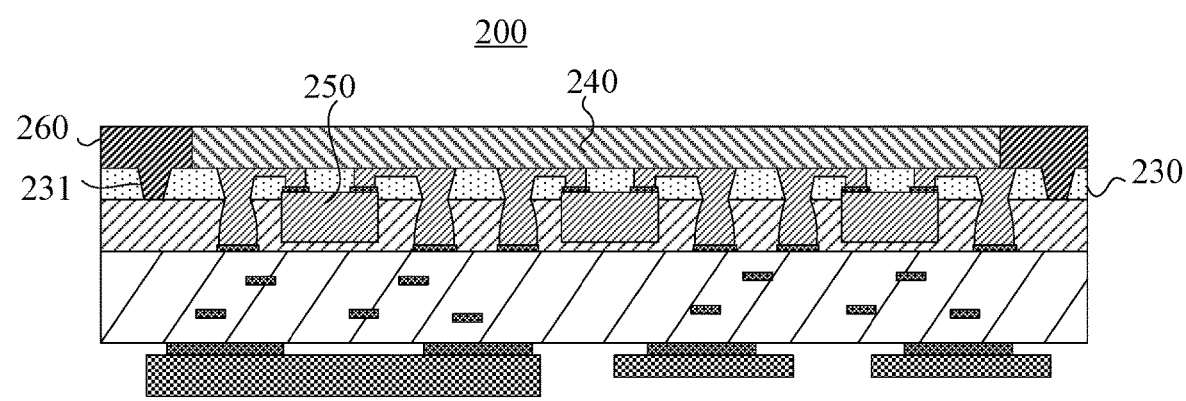
FIG. 2 is a schematic view illustrating a lateral cross section of a COB LED package according to another embodiment of the present disclosure.

FIG. 2 is a schematic view illustrating a lateral cross section of a COB LED package according to another embodiment of the present disclosure. As shown in FIG. 2, a LED display module 200 according to this embodiment includes a black resin layer 260 over a transparent layer 230. Unlike the embodiment of FIG. 1, this LED display module 200 in FIG. 2 has a transparent window 240 over a set of R, G and B LED chips 250. The transparent window 240 may be made of a transparent epoxy or an epoxy optical having diffuser so that different colors from each RGB unit can be mixed in this transparent window to provide a white light. Other configurations of the LED display module 200 of this embodiment are the same as the LED display 100 module illustrated in FIG. 1, and the details of such configurations are omitted.

FIG. 3A to 8C show a method of fabricating a LED display module according to one embodiment of the present disclosure.

Figure 3A:
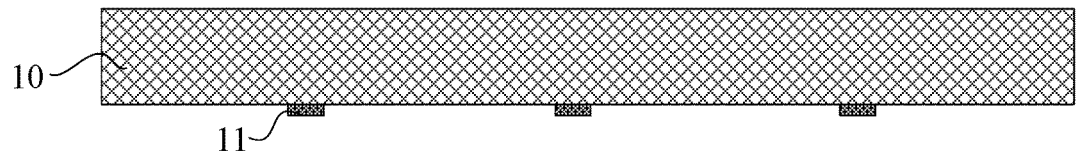
FIGS. 3A, 3B, 3C and 3D show a method of providing a panel having an array of LED chips according to one embodiment of the present disclosure.
Figure 3B:
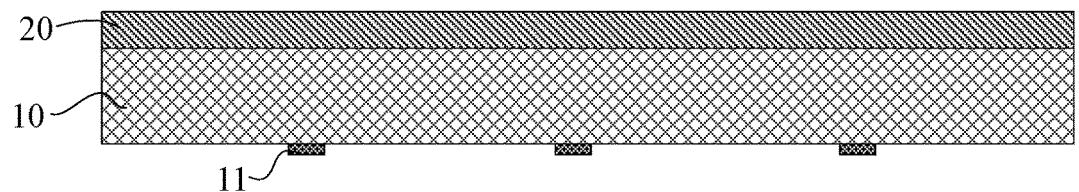
Figure 3C:
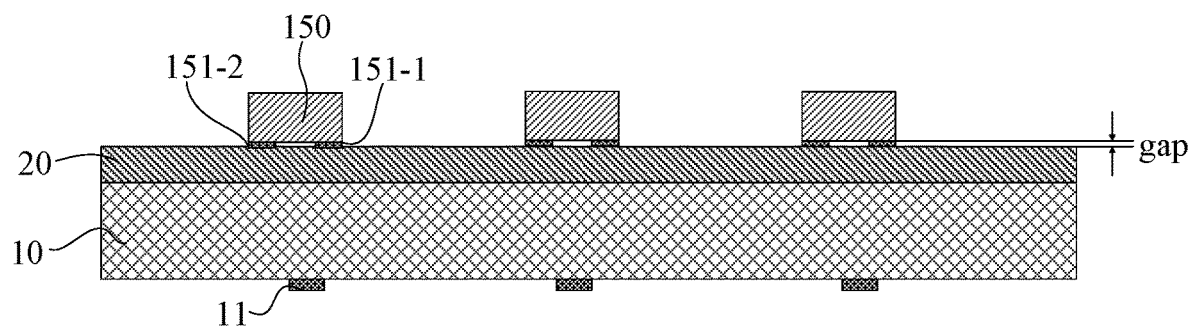
Figure 3D:
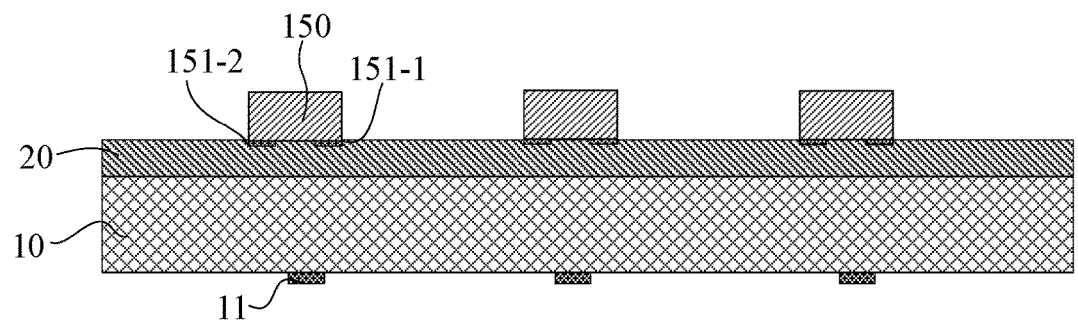

FIGS. 3A, 3B, 3C and 3D show a method of providing a panel having an array of LED chips. In this method, a glass substrate 10 having the same width as the PCB is prepared (see FIG. 3A). To prevent breakage during a fabricating process, edge grinding may be conducted for this substrate. A plurality of fiducial marks 11 are attached on a surface of the substrate 10 for alignment by a machine. A thermal release tape 20 is attached onto the glass substrate (see FIG. 3B). A pressure sensitive adhesive is applied on the top surface of the thermal release tape 20, while a thermal release adhesive is applied on the bottom surface of the tape 20 which is directly attached onto the glass substrate 10. An array of LED chips 150 including a matrix of RGB LED units, each having a red LED, a green LED, and a blue LED, are disposed on the thermal release tape 20 (see FIG. 3C). In this embodiment, the LED chips 150 have the same height. Each LED chip 150 has a p-electrode 151-1 and an n-electrode 151-2. When placing the LED chips 150 on the thermal release tape 20, the LED chips 150 are flipped over such that their electrodes 151-1 and 151-2 are directly attached to the thermal release tape 20 at the surface of the pressure sensitive adhesive. Then, the array of LED chips 150 is pressed against the thermal release tape 20 to minimize a gap between the array of LED chips 150 and the thermal release tape 20 (see FIG. 3D). As a result, the electrodes 151-1 and 151-2 of the LED chips 150 are buried in a surface layer of the pressure sensitive adhesive of the thermal release tape 20 as shown in FIG. 3D.

Figure 4A:
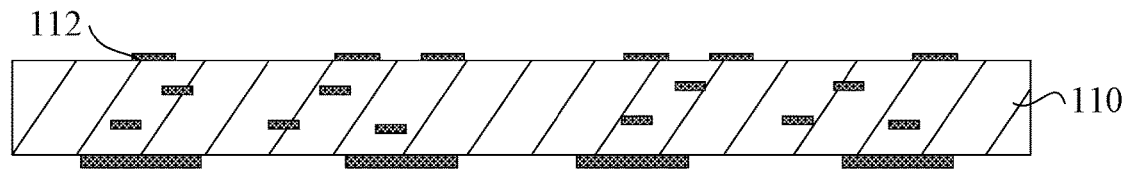
FIGS. 4A, 4B and 4C show a method of providing a PCB according to one embodiment of the present disclosure.
Figure 4B:
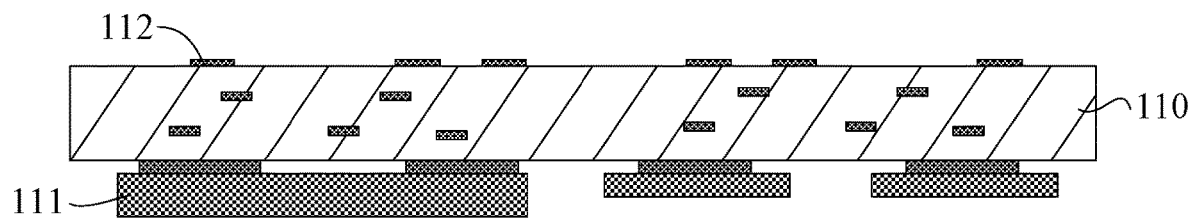
Figure 4C:
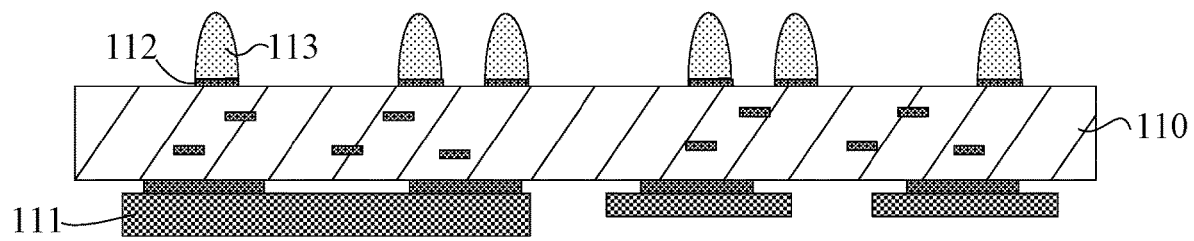

FIGS. 4A, 4B and 4C show the preparation of the PCB. The PCB substrate 110 has a plurality of conductive pads 112 on the top surface (FIG. 4A). In some embodiments, the conductive pads 112 are flat, usually tin-lead, silver, or gold-plated copper pads without holes. A surface mount technology (SMT) process is performed on the PCB substrate 110 to place one or more electronic components 111 on the bottom surface of the PCB substrate 110 (FIG. 4B). The electronic components 111 may include integrated circuit (IC) passive components such as inductors, resistors, capacitors, etc. Silk-screening may be also performed on the component side to identify the components, test points, part numbers, etc. Then, as a reflow soldering process, a plurality of lead-free solder columns 113 are disposed on the plurality of conductive pads 112 on the top surface of the PCB substrate 110 (FIG. 4C). In this embodiment, the height of each solder column 113 is larger than the height of the LED chip 150.

Figure 5A:
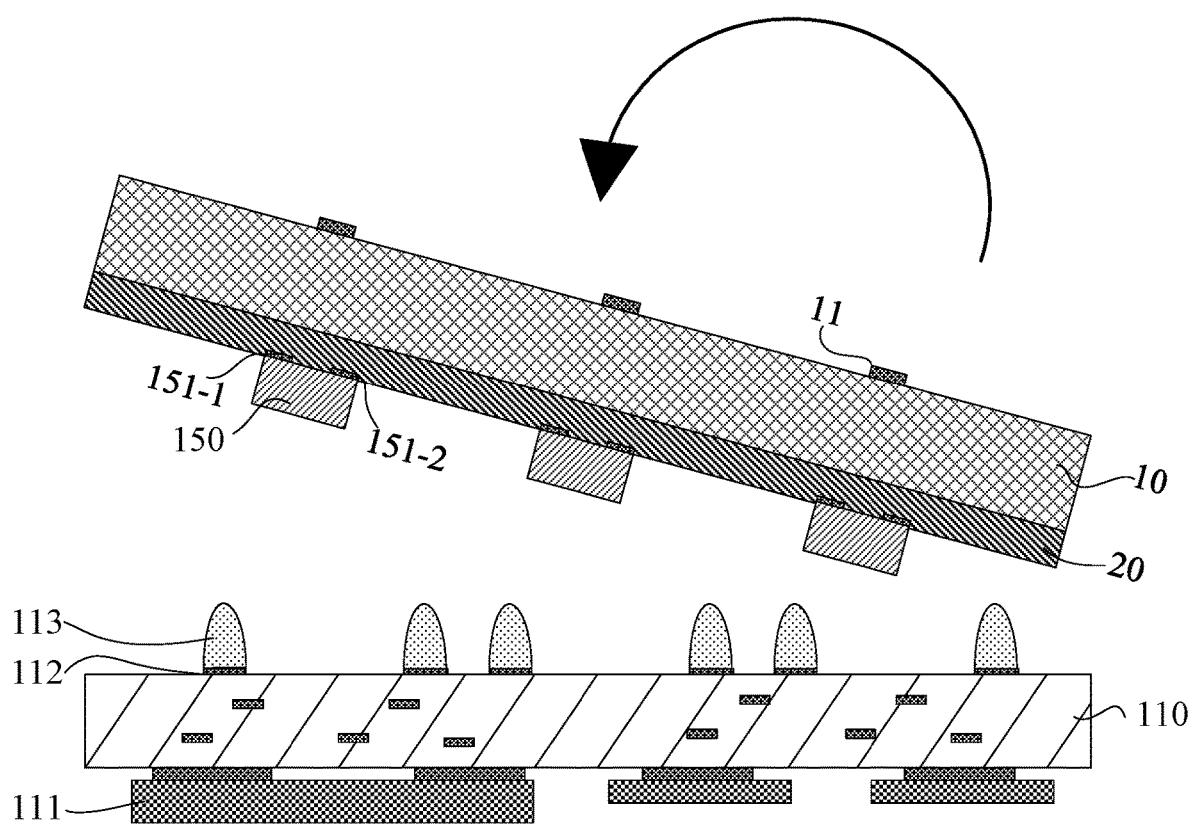
FIGS. 5A, 5B and 5C show a method of flipping the panel having the array of LED chips and aligning the same with the PCB according to one embodiment of the present disclosure.
Figure 5B:
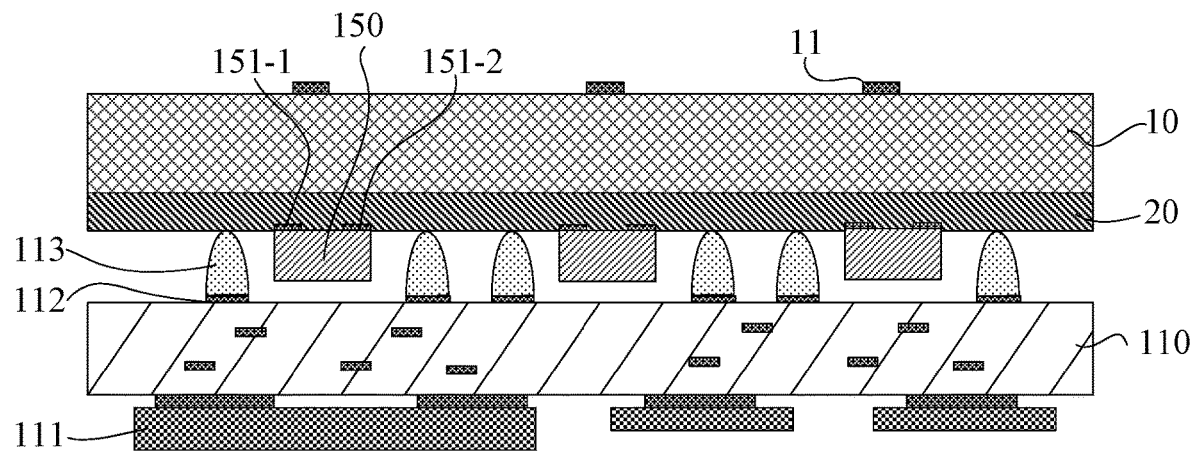
Figure 5C:
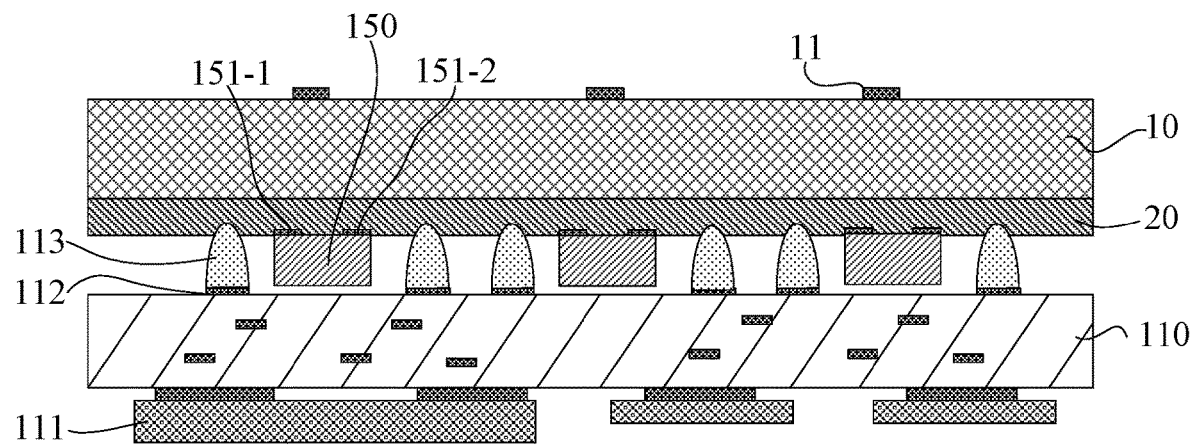

FIGS. 5A, 5B and 5C show the step of flipping the panel having the array of LED chips and aligning the same with the PCB. The panel 10 and 20 having the array of the LED chips 150 is flipped (FIG. 5A), and it is aligned with the PCB 110 such that the LED chips 150 face the PCB 110 (FIG. 5B). Since the height of the solder columns 113 is larger than the height of the LED chips 150, the LED chips 150 do not contact the surface of the PCB 110. Then, the panel 10 and 20 having the array of LED chips 150 is pressed against the PCB 110 so that an end of each of the plurality of solder columns 113 is partially buried in the thermal release tape 20, while the LED chips 150 still do not contact the surface of the PCB 110.

Figure 6A:
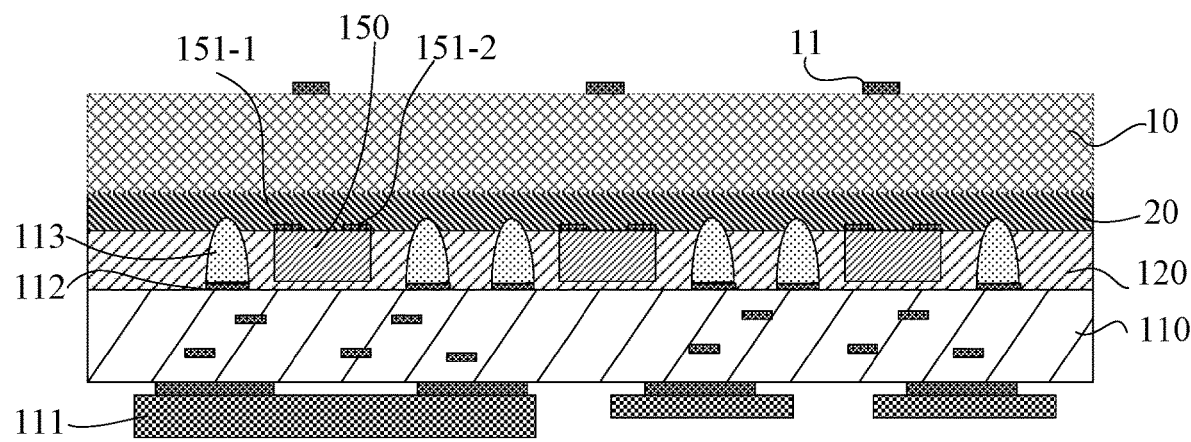
FIGS. 6A and 6B show a method of filling in a space between the panel having the array of LED chips and the PCB, and removing the panel from the PCB according to one embodiment of the present disclosure.
Figure 6B:
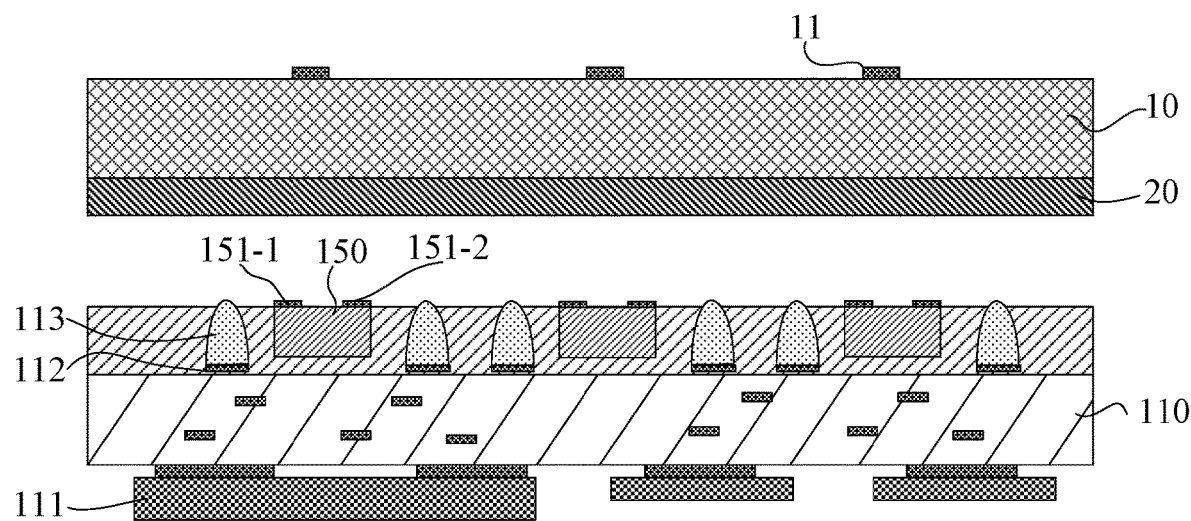

FIGS. 6A and 6B show the step of filling in a space between the panel 10 and 20 having the array of LED chips 150 and the PCB 110, and removing the panel 10 and 20 from the PCB 110. An opaque molding compound is filled into the space between the panel 10 and 20 having the array of LED chips 150 and the PCB 110 and cured to form an opaque layer 120 (FIG. 6A). Then, the glass substrate 10 and the thermal release tape 20 are removed from the PCB 110 by heating required for releasing the thermal release adhesive. As a result, the array of LED chips 150 are detached from the panel 10 and 20 and are partially buried and fixed in the opaque layer 120 (FIG. 6B). The p and n-electrodes 151-1 and 151-2 of each of the array of LED chips 150 and the end of each of the plurality of solder columns 113 are exposed.

Figure 7A:
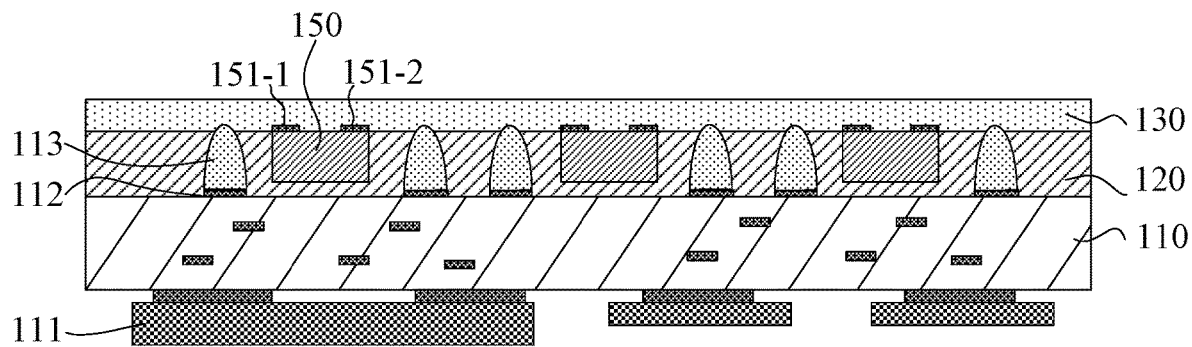
FIGS. 7A, 7B and 7C show a method of covering a transparent layer over the opaque layer and engraving the transparent layer according to one embodiment of the present disclosure.
Figure 7B:
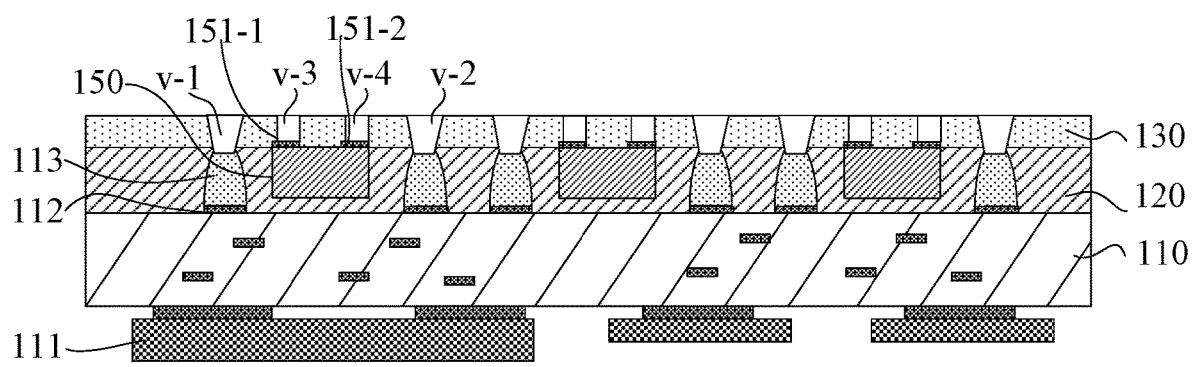
Figure 7C:
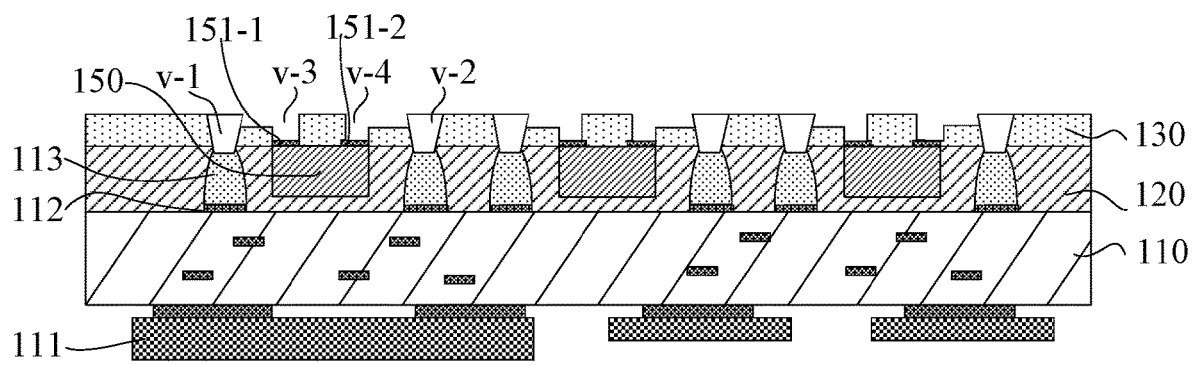

FIGS. 7A, 7B and 7C show a method of covering a transparent layer over the opaque layer and engraving the transparent layer. The first transparent layer 130 is molded on the opaque layer 120 (FIG. 7A). In this embodiment, the first transparent layer 130 can be formed by photolithography method, in which the molding of the first transparent layer 130 can be conducted by spin coating of a photoresist which stays in the structure as a molding material after curing process and is then engraved by UV or laser etching. The first transparent layer 130 is made from a resin, an epoxy, or a silicone. The first transparent layer is engraved to form a plurality of via holes v-1 to v-4 (FIG. 7B). Each of the plurality of via holes v-1 to v-4 leads to each of the plurality of solder columns 113 or each of the p-electrode 151-1 and the n-electrode 151-2 of each of the array of the LED chips 150. Engraving of the vial holes v-1 to v-4 may be performed by a laser etching. After engraving, the surface of the first transparent layer 130 may be cleaned by plasma descumming. Then, the first transparent layer 130 is engraved to form a plurality of trenches t-1 and t-2 between two or more via holes v-1 to v-4 (FIG. 7C). Engraving of the trenches t-1 and t-2 may also be performed by a laser etching.

Figure 8A:
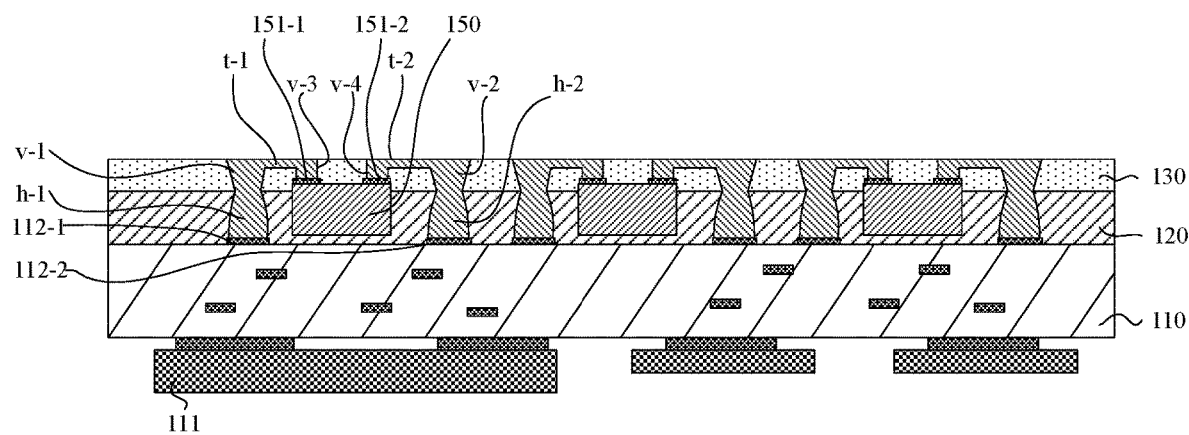
FIGS. 8A, 8B and 8C show a method of printing a conductive material on the transparent layer and encapsulating the array of LED chips and the conductive tracks according to one embodiment of the present disclosure.
Figure 8B:
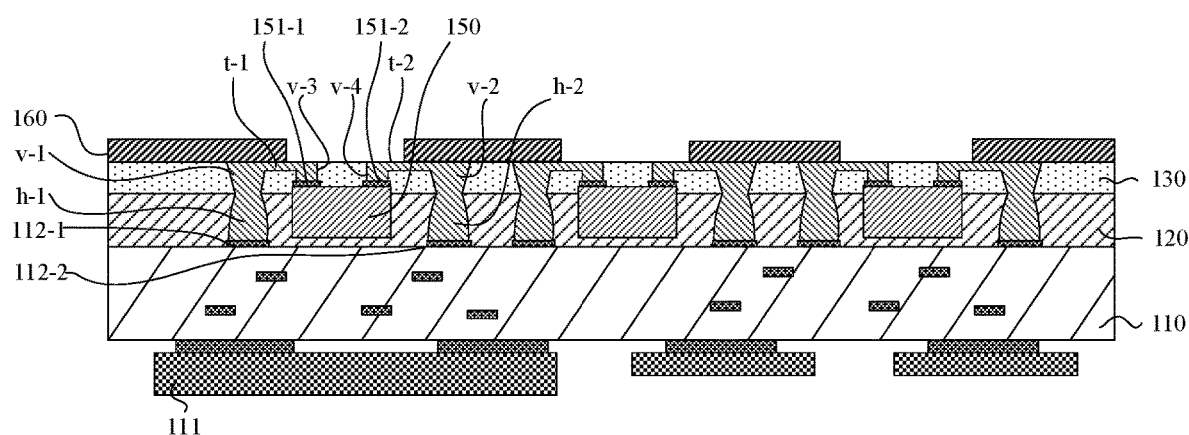
Figure 8C:
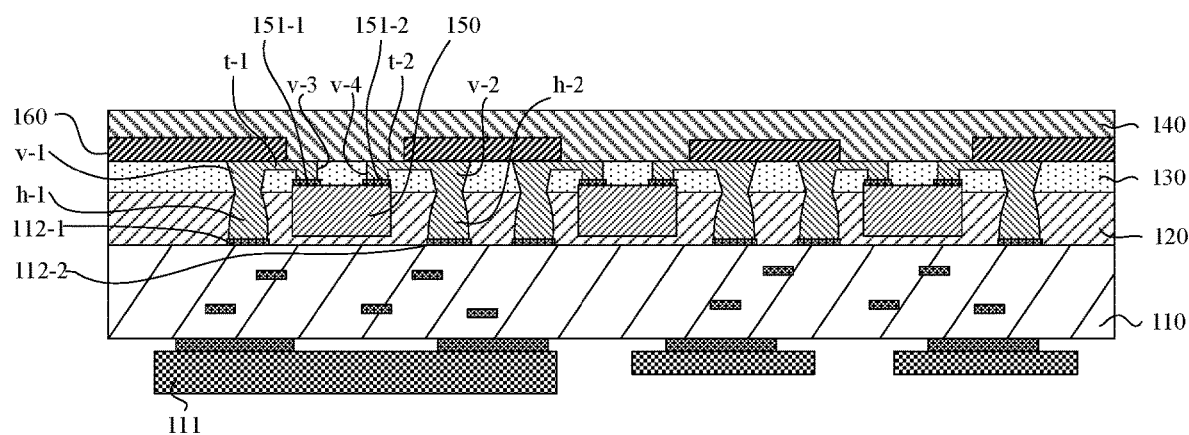

FIGS. 8A, 8B and 8C show the step of printing a conductive material on the transparent layer and encapsulating the array of LED chips and the conductive tracks.

A conductive material is printed on the first transparent layer 130 to fill in the plurality of via holes v-1 to v-4 and the plurality of trenches t-1 and t-2 so that the plurality of LED chips 150 are electrically connected to the PCB 110, and two or more of the plurality of LED chips 150 are interconnected by the conductive track (FIG. 8A). Printing the conductive material may be performed by inkjet printing or electron beam evaporation. The conductive material can be tin-lead, silver, or gold, or a mixture of tin-lead and silver. A black resin is disposed on the first transparent layer 130 to form a black resin portion 160 partially covering the first transparent layer 130 (FIG. 8B). Disposing the black resin on the first transparent layer 130 may be conducted by a molding or an inkjet printing. In another embodiment, the black resin portion 160 can be formed by photolithography method, in which the molding of the black resin portion 160 can be conducted by spin coating of a photoresist which stays in the structure as a molding material after curing process and is then engraved by UV or laser etching. The black resin can be a mixture of black pigment and one of a resin, an epoxy, and a silicone. Then, a second transparent layer 140 is molded on the first transparent layer 130 and the black resin portion 160 to encapsulate the array of LED chips 150 and the conductive material filled in the plurality of via holes v-1 to v-2 and the plurality of trenches t-1 and t-2 (FIG. 8C). The second transparent layer 140 may be made of a transparent epoxy or an epoxy optical having diffusers so that different colors from each RGB unit can be mixed in the second transparent layer 140 to provide a white light.

Figure 9A:
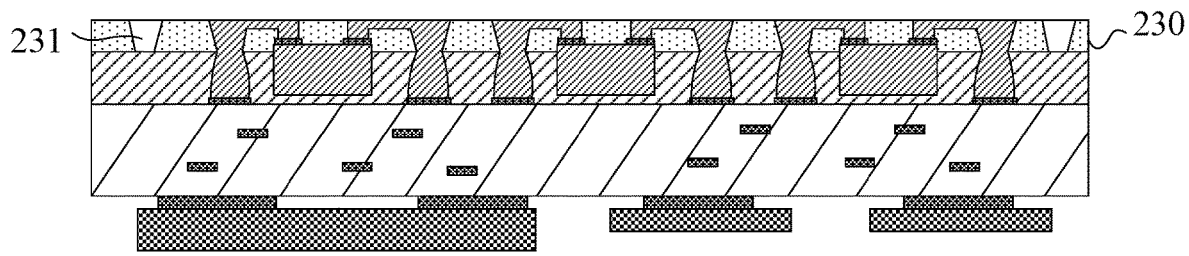
FIGS. 9A, 9B, 9C and 9D show a method of printing a metal ink on the transparent layer and encapsulating the array of LED chips and the metal tracks according to another embodiment of the present disclosure.
Figure 9B:
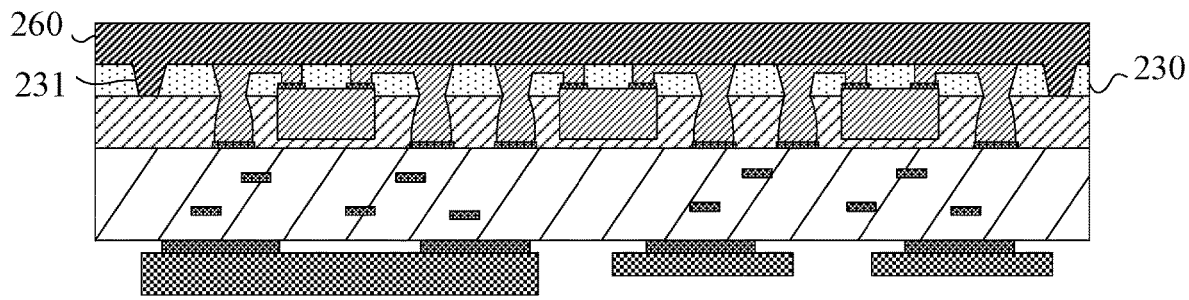
Figure 9C:
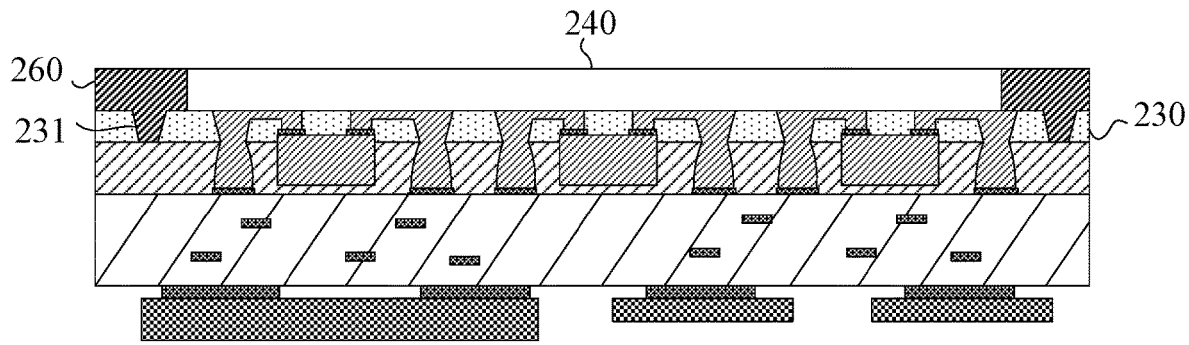
Figure 9D:
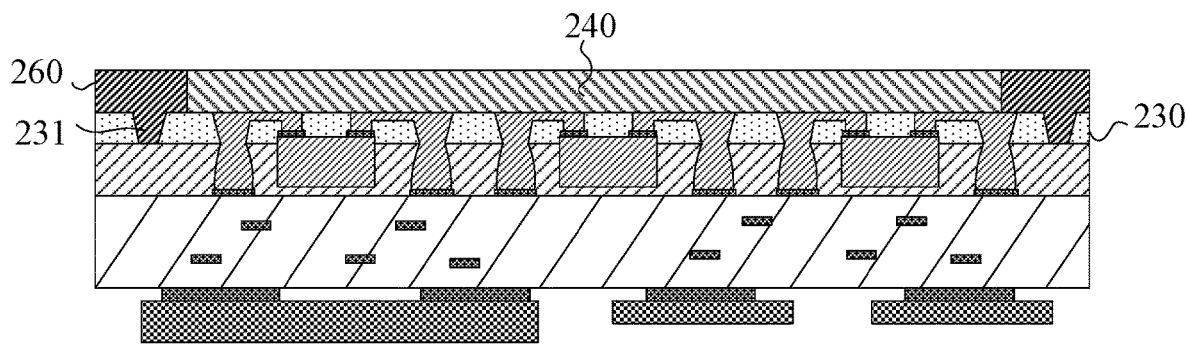

FIGS. 9A, 9B, 9C and 9D show the step of printing a metal ink on the transparent layer and encapsulating the array of LED chips and the metal tracks according to another embodiment of the present disclosure. In this embodiment, after printing a conductive material on a transparent layer 230 to fill in a plurality of via holes and a plurality of trenches for the array of LED chips, a pair of additional holes 231 for each RGB LED unit are formed on the transparent layer 230 (FIG. 9A). A black resin layer 260 is then molded or printed on the transparent layer 230 with a black resin (FIG. 9B). This black resin is also filled in the additional holes 231 on the transparent layer 230 to form black walls. The black resin can be a mixture of black pigment and one of a resin, an epoxy, and a silicone. Then, the black resin layer 260 is engraved to expose the set of R, G and B LED chips so as to form a color-mixing cavity (FIG. 9C). To cover a color-mixing window 240, a transparent epoxy or an epoxy optical having diffuser may be filled in the color-mixing cavity (FIG. 9D). In this embodiment, the additional holes 231 filled with the black resin may enable the black resin layer 260 to be anchored in other molding layers and support the color-mixing window 240. In another embodiment, the black resin layer 260 can be formed by photolithography method, in which the molding of the black resin layer 260 can be conducted by spin coating of a photoresist which stays in the structure as a molding material after curing process and is then engraved by UV or laser etching.

Embodiments of the present disclosure have been described in detail. Other embodiments will become apparent to those skilled in the art from consideration and practice of the present disclosure. Accordingly, it is intended that the specification and the drawings be considered as exemplary and explanatory only, with the true scope of the present disclosure being set forth in the following claims.

What is claimed is:

1. A light emitting diode (LED) display module, comprising:
   a printed circuit board (PCB) having a plurality of conductive pads disposed on a surface of the PCB;
   one or more layers of molding compound disposed on the surface of the PCB;
   a network of conductive tracks residing in or on the one or more layer of molding compound away from the PCB;
   a plurality of through-holes extending through the one or more layers of molding compound, each leading to one of the plurality of conductive pads; and
   an array of LED chips disposed in the one or more layers of molding compound,
   wherein each of the array of LED chips has a p-electrode and an n-electrode, wherein each of the p-electrode and the n-electrode is connected to one of the plurality of the conductive pads via a conductive path, wherein the conductive path comprises a conductive material inside one of the plurality of through-holes and a portion of the network of conductive tracks.

2. The LED display module of claim 1, comprising a first layer of molding compound disposed on the PCB and a second layer of molding compound disposed on the first layer of molding compound, wherein the network of conductive tracks resides in or on the second layer of molding compound.

3. The LED display module of claim 2, wherein the second layer of molding compound is formed by spin coating and curing of a photoresist, which is engraved by UV or laser etching.

4. The LED display module of claim 1, wherein the network of conductive tracks is applied by inkjet printing or deposited by electron beam evaporation.

5. The LED display module of claim 1, wherein each of the array of LED chips is constructed without a base substrate made of sapphire or silicon carbide (SiC).

6. The LED display module of claim 2, further comprising a third layer of molding compound encapsulating the array of LED chips and the network of conductive tracks.

7. The LED display module of claim 2, further comprising a black resin portion partially covering the second layer of molding compound.

8. The LED display module of claim 6, wherein the third layer of molding compound is disposed over a set of R, G and B LED chips to form a color-mixing window, wherein the color-mixing window is made from a transparent epoxy or an epoxy optical diffuser disposed therein.

9. A method of fabricating a light emitting diode (LED) display module of claim 1, the method comprising:
   providing a panel and disposing an array of LED chips, each having a p-electrode and an n-electrode, on the panel;
   providing a printed circuit board (PCB) having a plurality of conductive pads on a surface of the PCB;
   flipping the panel having the array of LED chips thereon and aligning the panel with the PCB such that the LED chips face the PCB;
   filling, with an opaque molding compound, in a space between the panel having the array of LED chips and the PCB to form an opaque layer;
   removing the panel from the opaque layer, wherein the array of LED chips is detached from the panel and is partially buried in the opaque layer;
   covering a transparent layer of a transparent molding compound over the opaque layer, wherein the transparent layer having a plurality of through-holes, and a plurality of trenches connecting two or more through-holes; and
   disposing a conductive material on the transparent layer to fill in the plurality of through-holes and the plurality of trenches with the conductive material, whereby the plurality of LED chips is electrically connected to the PCB and two or more of the plurality of LED chips are interconnected.

10. The method of claim 9, wherein the step of providing the panel and disposing the array of LED chips comprises:
    preparing a glass substrate;
    attaching a thermal release tape onto the glass substrate; and
    disposing the array of LED chips, arranged in rows and columns, on the thermal release tape.

11. The method of claim 9, wherein each of the array of LED chips is constructed without a base substrate made of sapphire or silicon carbide (SiC).

12. The method of claim 9, wherein the step of providing the PCB comprises:
    preparing a PCB substrate;
    performing a surface mount technology (SMT) process on the PCB substrate to place one or more electronic components on a bottom surface of the PCB substrate; and
    disposing a plurality of lead-free solder columns on the plurality of conductive pads on a top surface of the PCB substrate.

13. The method of claim 12, wherein the step of flipping the panel and aligning the panel with the PCB comprises pressing the panel having the array of LED chips against the PCB after aligning the panel with the PCB so that an end of each of the plurality of solder columns is partially buried in the thermal release tape.

14. The method of claim 10, wherein the step of removing the panel comprises:

removing the glass substrate and the thermal release tape; and exposing contacts of each of the array of LED chips and the end of each of the plurality of solder columns.

15. The method of claim 9, wherein covering the transparent layer over the opaque layer comprises:

molding a transparent layer on the opaque layer;

engraving the transparent layer to form a plurality of through-holes, wherein each of the plurality of through-holes leads to each of the plurality of solder columns or each of the p-electrode and the n-electrode of each of the array of the LED chips; and etching the transparent layer to form a plurality of trenches, wherein each of the plurality of trenches connects two or more through-holes from each other.

16. The method of claim 15, wherein the step of molding the transparent layer includes spin coating and curing of a photoresist, which is engraved by UV or laser etching.

17. The method of claim 15, wherein the step of engraving the transparent layer comprises:

engraving the transparent layer by laser etching to form the plurality of through-holes; and cleaning the surface of the transparent layer by a plasma descumming.

18. The method of claim 9, wherein the step of disposing the conductive material on the transparent layer is conducted by inkjet printing or electron beam evaporation.

19. The method of claim 9, further comprising disposing a black resin on the transparent layer to form a black resin portion partially covering the transparent layer.

20. The method of claim 19, further comprising covering a second transparent layer over the transparent layer and the black resin portion to encapsulate the array of LED chips and the conductive material filled in the plurality of through-holes and the plurality of trenches.

21. The method of claim 9, further comprising covering black resin layer over the transparent layer.

22. The method of claim 21, further comprising:

etching the black resin layer and exposing a set of R, G and B LED chips to form a color-mixing cavity; and filling the color-mixing cavity with a transparent epoxy or an epoxy optical diffuser disposed therein to form a color-mixing window.

* * * * *